(12) United States Patent
Chen et al.

(10) Patent No.: US 8,710,515 B2
(45) Date of Patent: Apr. 29, 2014

(54) LIGHT-EMITTING DEVICE

(75) Inventors: Chao-Hsing Chen, Hsinchu (TW);
Schang-Jing Hon, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 186 days.

(21) Appl. No.: 12/874,666

(22) Filed: Sep. 2, 2010

(65) Prior Publication Data

US 2011/0062456 A1 Mar. 17, 2011

Related U.S. Application Data

(60) Provisional application No. 61/241,605, filed on Sep. 11, 2009.

(51) Int. Cl.
*H01L 33/00* (2010.01)

(52) U.S. Cl.
USPC .............. 257/88; 257/92; 257/98; 257/103; 257/E27.121

(58) Field of Classification Search
USPC ................. 257/88, 92, 98, 103, E27.121
See application file for complete search history.

(56) References Cited

U.S. PATENT DOCUMENTS

| | | | | |
|---|---|---|---|---|
| 6,661,029 | B1 * | 12/2003 | Duggal | 257/89 |
| 2005/0224822 | A1 * | 10/2005 | Liu | 257/84 |
| 2008/0211400 | A1 * | 9/2008 | Kim et al. | 313/506 |
| 2010/0177155 | A1 * | 7/2010 | Kii | 347/224 |

* cited by examiner

*Primary Examiner* — Tan N Tran
(74) *Attorney, Agent, or Firm* — Muncy, Geissler, Olds & Lowe, P.C.

(57) ABSTRACT

This disclosure discloses a light-emitting device. The light-emitting device comprises: a substrate; and a first light-emitting unit comprising a plurality of light-emitting diodes electrically connected to each other on the substrate. A first light-emitting diode in the first light-emitting unit comprises a first semiconductor layer with a first conductivity-type, a second semiconductor layer with a second conductivity-type, and a light-emitting stack formed between the first and second semiconductor layers. The first light-emitting diode in the first light-emitting unit further comprises a first connecting layer on the first semiconductor layer for electrically connecting to a second light-emitting diode in the first light-emitting unit; a second connecting layer, separated from the first connecting layer, formed on the first semiconductor layer; and a third connecting layer on the second semiconductor layer for electrically connecting to a third light-emitting diode in the first light-emitting unit.

8 Claims, 5 Drawing Sheets

US 8,710,515 B2

LIGHT-EMITTING DEVICE

This application claims the benefit of provisional application No. 61/241,605 filed on Sep. 11, 2009; the contents of which are incorporated herein by reference in their entirety.

BACKGROUND

1. Technical Field

The present disclosure relates to a light-emitting device.

2. Description of the Related Art

The light-emitting diodes (LEDs) of the solid-state lighting elements have the characteristics of the low power consumption, low heat generation, long operational life, shockproof, small volume, quick response and good opto-electrical property like light emission with a stable wavelength, so the LEDs have been widely used in household appliances, indicator light of instruments, and opto-electrical products, etc. As the opto-electrical technology develops, the solid-state lighting elements have great progress in the light efficiency, operation life and the brightness, and LEDs are expected to become the main stream of the lighting devices in the near future.

Generally speaking, the conventional LED is driven by direct current (DC). An AC-DC inverter is required to invert DC to AC. Since the inverter has a large volume and heavy weight, the cost is added and the power is loss during inverting. It is difficult for LED to compete with the existing light source mainly because of the price concern. Therefore, there is a need for development of an AC-operated LED device without the AC/DC inverter.

SUMMARY OF THE DISCLOSURE

The present disclosure provides a light-emitting device.

The light-emitting device comprises: a substrate; and a first light-emitting unit comprising a plurality of light-emitting diodes electrically connected to each other on the substrate. A first light-emitting diode in the first light-emitting unit comprises a first semiconductor layer with a first conductivity-type, a second semiconductor layer with a second conductivity-type, and a light-emitting stack formed between the first and second semiconductor layers. The first light-emitting diode in the first light-emitting unit further comprises a first connecting layer on the first semiconductor layer for electrically connecting to a second light-emitting diode in the first light-emitting unit; a second connecting layer, separated from the first connecting layer, formed on the first semiconductor layer; and a third connecting layer on the second semiconductor layer for electrically connecting to a third light-emitting diode in the first light-emitting unit.

In another embodiment of the present disclosure, a light light-emitting device is provided. The light-emitting device comprises: a substrate; and a plurality of light-emitting units electrically connected to each other on the substrate; wherein a first light-emitting unit of the plurality of the light-emitting units comprises a first connecting layer disposed on one side of the first light-emitting unit for connecting to an adjacent light-emitting unit in a first connecting direction, and a second connecting layer disposed on another side of the first light-emitting unit for connecting to another adjacent light-emitting unit in a second connecting direction which is not parallel to the first connecting direction.

In another embodiment of the present disclosure, a light light-emitting device is provided. The light-emitting device comprises: a light-emitting diode comprising a first terminal, a second terminal, and a third terminal; wherein, a first current flow flows through the first and second terminals, and a second current flow different from the first current flow flows through the third terminal and one of the first and second terminals such that the light-emitting diode emits light.

BRIEF DESCRIPTION OF THE DRAWINGS

The accompanying drawings are included to provide easy understanding of the application, and are incorporated herein and constitute a part of this specification. The drawings illustrate the embodiments of the application and, together with the description, serve to illustrate the principles of the application.

DETAILED DESCRIPTION OF THE EMBODIMENTS

For to better and concisely explain the disclosure, the same name or the same reference number given or appeared in different paragraphs or figures along the specification should has the same or equivalent meanings while it is once defined anywhere of the disclosure.

The following shows the description of the embodiments of the present disclosure in accordance with the drawings.

Figure 1:
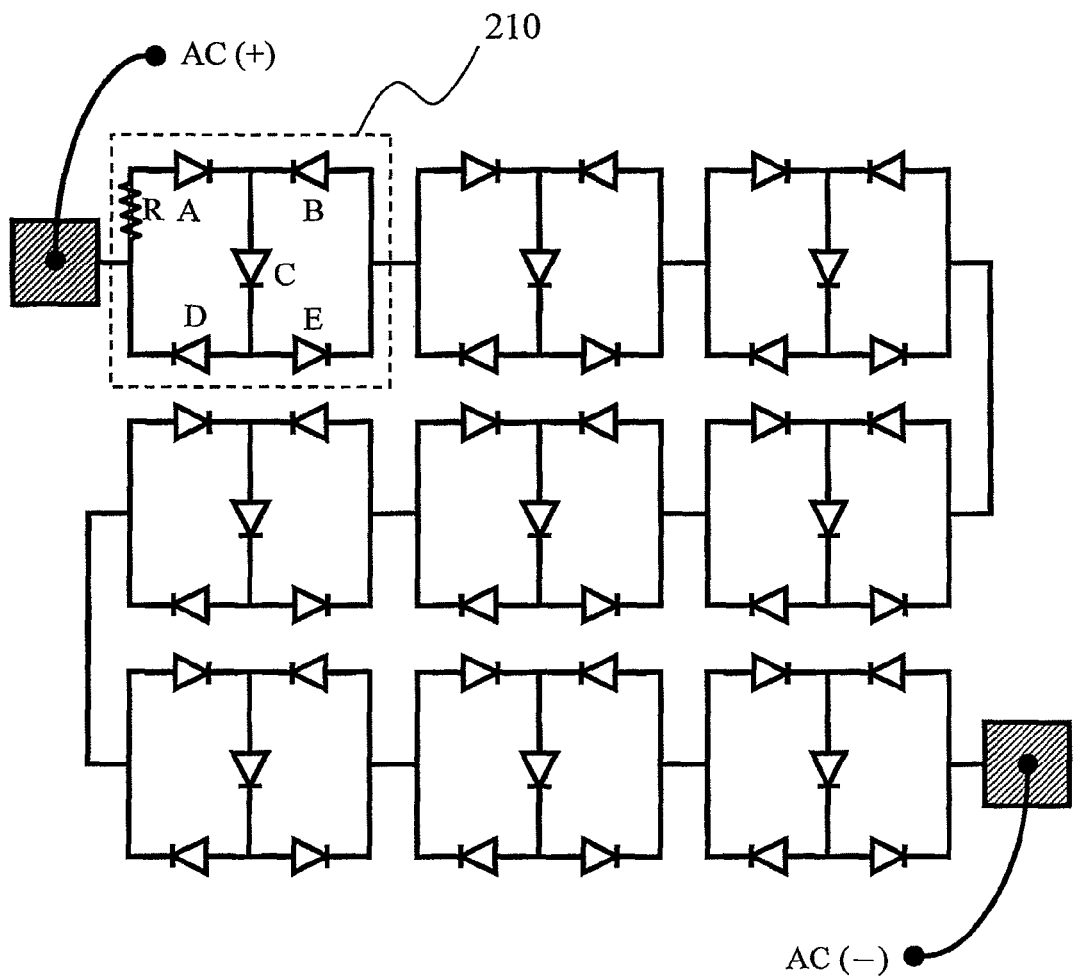
FIG. 1 shows a circuit diagram of a light-emitting device in accordance with the first embodiment of the present disclosure.

FIG. 1 discloses a light-emitting device 200 according to the first embodiment of the present disclosure. The light-emitting device 200 comprises a plurality of light-emitting units 210 electrically connected in series to each other, and further connected to an external alternating current (AC) power supply. Each of the light-emitting units 210 comprises a first light-emitting group (LEDs B and D), and a second light-emitting group (LEDs A and E) for rectifying an alternating current signal of the AC power supply to a direct current signal for light emission, and a bridge light-emitting diode (LED C). The first and second light-emitting groups and the bridge light-emitting diode form a full wave bridge rectifier configuration, e.g. the configuration of Wheatstone bridge on a common substrate 200.

Figure 2A:
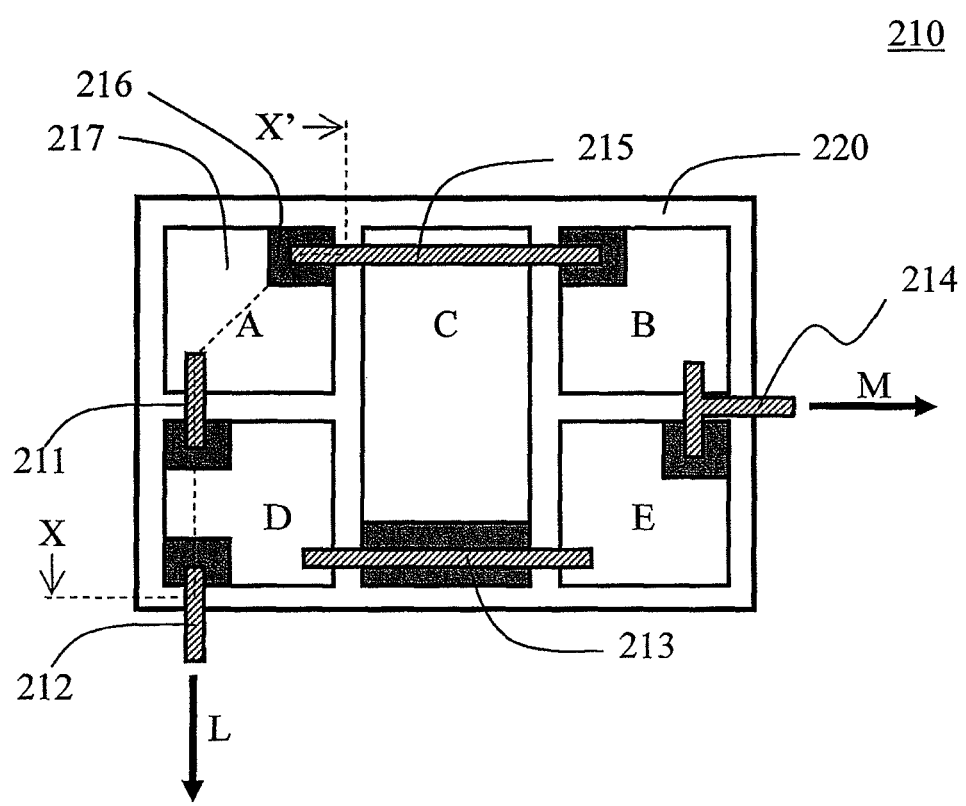
FIG. 2A shows a top view of a light-emitting unit of the light-emitting device in accordance with the first embodiment of the present disclosure.

FIG. 2A shows a top view of the light-emitting unit 210 in accordance with the first embodiment of the present disclosure. The light-emitting unit 210 comprises a first connecting layer 211, a second connecting layer 212, a third connecting layer 213, a fourth connecting layer 214, and a fifth connecting layer 215. Each of the LEDs A~E comprises an n-type region (dark area) 216 and a p-type region 217. The p-type region 217 of the LED A and the n-type region 216 of the LED D are electrically connected by the first connecting layer 211;

the n-type regions 216 of the LEDs A and B and the p-type region 217 of the LED C are electrically connected by a fifth connecting layer 215; the n-type region 216 of the LED C and the p-type regions 217 of the LEDs D and E are electrically connected by a third connecting layer 213; and the p-type region 217 of LED B and the n-type region 216 of LED E are electrically connected by the fourth connecting layer 214. The second and fourth connecting layers 212, 214 electrically connect the light-emitting unit 210 to adjacent units or the AC power supply (not shown). In the positive cycle of the AC power supply, a first current flow from the anode (+) of the AC power supply is provided to the light-emitting device 200 and flows through each of the plurality of serially-connected light-emitting units 210. More specifically, the first current flow is supplied to the second connecting layer 212 of the light-emitting unit 210 and forward biasing the LEDs A, C and E (LEDs B and D are under reverse-biased), then through the fourth connecting layer 214 to an adjacent unit, lastly back to the cathode (−) of the AC power source. On the contrary, in the negative cycle of the AC power source, a second current flow from the cathode (−) of the AC power supply is supplied to the fourth connecting layer 214 of the light-emitting unit 210 and forward biasing the LEDs B, C and D (LEDs A and E are under reverse-biased), then through the second connecting layer 212 to another adjacent unit, lastly back to the anode (+) of the AC power source. The bridge light-emitting diode (LED C) is capable to emit light in the positive and negative cycles during AC operation.

Each of the light-emitting units 210 is arranged in a full wave bridge rectifier configuration and comprises a minimum number of LEDs, which is five. By this arrangement, the light-emitting device 200 fulfills both reliability and life-time requirement. The arrangement of only one LED between the connecting layers can significant lower the risk of reverse-breakdown, especially when the light-emitting device 200 is a single chip.

It is noted that the foregoing light-emitting unit 210 is not limited to include just one bridge light-emitting diode (LED C). Two or more serially connected LEDs instead of one LED C are still under the scope in accordance with the present disclosure for better luminous efficiency. The light-emitting device 200 comprising the plurality of the light-emitting units 210 that commonly form a single chip on the common substrate 220 has a chip-level dimension of 0.3 mm to 5 mm. In another embodiment, each of the light-emitting units 210 forms individual LED chip. The light-emitting device 200 comprising the LED chips of the light-emitting units 210 forms a package on a common submount having the package-level dimension of above 5 mm. It is noted that the interconnection between the light-emitting units 210 is not limited to serial and/or parallel connection.

Furthermore, as shown in FIG. 2A, the second connecting layer 212 is disposed at one side of the light-emitting unit 210 for electrically connecting to an adjacent light-emitting unit (not shown) or the AC power supply (not shown) in a first connecting direction (L) and the fourth connecting layer 214 is disposed at another side of the light-emitting unit 210 different from the one side for electrically connecting to another adjacent light-emitting unit (not shown) or the AC power supply (not shown) in a second connecting direction (M). The second connecting direction (M) is not parallel to the first connecting direction (L). In this embodiment, the second connecting direction (M) is perpendicular to the first connecting direction (L). Preferably, the first connecting direction (L) and the second connecting direction (M) are oriented with respect to each other by an angle ranging from 90° to 170°. The arrangement realizes the implementation of the light-emitting device 200 in a two-dimension configuration.

Figure 2B:
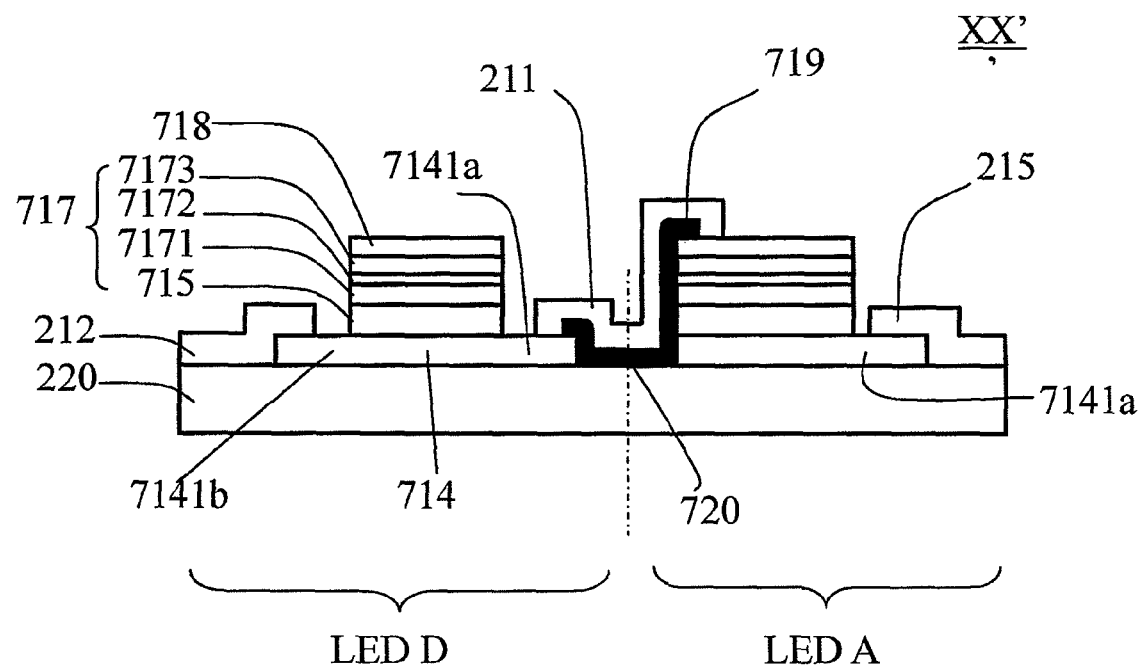
FIG. 2B shows a cross-sectional view of the light-emitting unit of the light-emitting device, taken along line XX' of FIG. 2A.

FIG. 2B shows a cross-sectional structure across the cross-section line XX' of FIG. 2A. Each of the LEDs A and D comprises a first semiconductor layer 714 with a first conductivity-type, a second semiconductor layer 718 with a second conductivity-type, and a light-emitting stack 717 formed between the first and second semiconductor layers 714, 718. In this embodiment, the first semiconductor layer 714 is an n-type semiconductor layer, and the second semiconductor layer 718 is a p-type semiconductor layer. The n-type semiconductor layer is formed on the common substrate 220 and has a first exposed portion 7141a. The light-emitting stack 717 is formed on and is ohmically contacted with the n-type semiconductor layer. The p-type semiconductor layer is formed on the light-emitting stack 717. The light-emitting stack 717 comprises an n-side contact layer 715 formed on the n-type semiconductor layer, an n-type semiconductor cladding layer 7171 formed on the n-side contact layer 715, an active layer 7172 formed on the n-type semiconductor cladding layer 7171, and a p-type semiconductor cladding layer 7173 formed on the active layer 7172. A trench 720 is formed between the LEDs A and D for physically separating the two LEDs upon the common substrate 220. The n-type semiconductor layer of the LED D further comprises a second exposed portion 7141b. The first connecting layer 211 is formed on the first exposed portion 7141a of the n-type semiconductor layer of the LED D and the p-type semiconductor layer of the LED A for electrically connecting therebetween. The second connecting layer 212 is formed on the second exposed portion 7141b of the n-type semiconductor layer of the LED D for electrically connecting to an adjacent light-emitting unit (not shown) or the AC power supply (not shown). The light-emitting stack 717 interposes between the first and second connecting layers 211, 212 to separate the first connecting layer 211 from the second connecting layer 212 on the n-type semiconductor layer of LED D. Because the first and second connecting layers 211, 212 are separated from each other on the n-type semiconductor layer of LED D, when a current flows through the first and second connecting layers 211, 212, the n-type semiconductor layer of LED D forms an embedded resistor (R). Preferably, each of the connecting layers 211, 212, 213, 214, 215 comprises metal. An insulating layer 719 is formed between the first connecting layer 211, the LEDs A and D, and the trench 720 to prevent any unwanted short-circuit path.

Figure 2C:
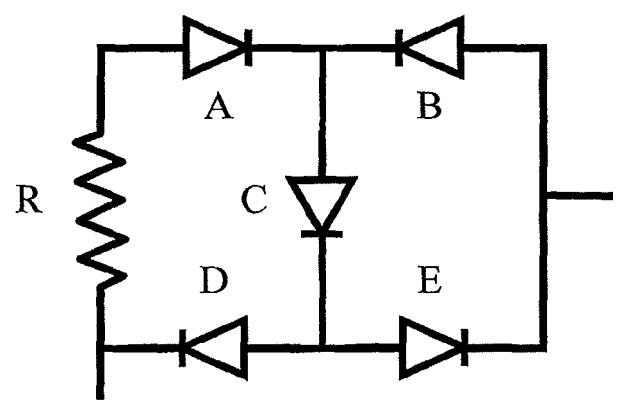
FIG. 2C shows a circuit diagram of the light-emitting unit of the light-emitting device in accordance with the first embodiment of the present disclosure.

As shown in FIGS. 2B and 2C, in the positive cycle of the AC power supply, the first current flow flows through the second connecting layer 212, the n-type semiconductor layer of the LED D, and the first connecting layer 211 to the second light-emitting group (LEDs A and E) and the bridge light-emitting diode (LED C). Simply, the first current flow flows from the embedded resistor R to the LEDs A, C, and E. Therefore, the second light-emitting group (LEDs A and E) and the bridge light-emitting diode (LED C) are forward biased to emit light It is noted that the embedded resistor R is not limited to be embedded within any of the five LEDs A~E in accordance with the present disclosure. The embedded resistor R can be formed in every light-emitting units 210 so as to provide a protection means to prevent the device from being broken down while being attacked by accidental over-voltage driving. The resistance of the embedded resistor R can be tuned by altering the doping concentration in the n-type semiconductor layer. Preferably, the n-type semiconductor layer comprises gallium nitride or gallium phosphide intentionally or unintentionally doped with Si, thereby having a resistivity ranging from 0.01 to 0.7 Ω-cm. The total voltage drop across the light-emitting device 200 can also be adjusted by tuning the resistance of the embedded resistor R to fulfill industry application, such as the application of 12V, 24V, 110V, 220V, or other power line systems.

On the contrary, in the negative cycle of the AC power supply, the second current flow flows through the first light-emitting group (LEDs B and D) and the bridge light-emitting diode (LED C), such that the LEDs B, C, and D are forward biased to emit light.

Figure 3A:
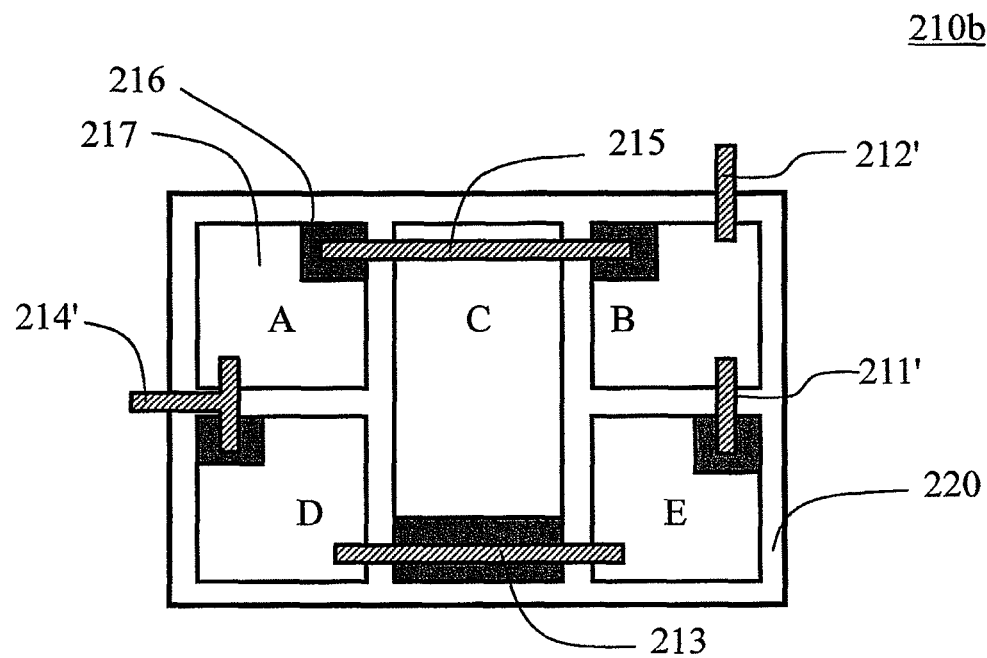
FIG. 3A shows a top view of a light-emitting unit of the light-emitting device in accordance with the second embodiment of the present disclosure.

FIG. 3A shows of a top view of the light-emitting unit 210b in accordance with the second embodiment of the present disclosure. The light-emitting unit 210b differs from the light-emitting unit 210 in that the first semiconductor layer 714 is the p-type semiconductor layer, and the second semiconductor layer 718 is the n-type semiconductor layer. The first and second connecting layer 211', 212' are formed on the p-type semiconductor layer of the LED B and separated from each other. In addition, the p-type region 217 of the LED A and the n-type region 216 of the LED D are electrically connected by the fourth connecting layer 214', and the p-type region 217 of LED B and the n-type region 216 of LED E are electrically connected by the first connecting layer 211'. Because the first and second connecting layers 211', 212' are separated from each other on the p-type semiconductor layer of the LED B, when a current flows through the first and second connecting layers 211', 212', the p-type semiconductor layer of the LED B forms the embedded resistor (R').

In this embodiment, in the positive cycle of the AC power supply, the first current flow flows through the second light-emitting group (LEDs A and E), the bridge light-emitting diode (LED C), the first connecting layer 211', the p-type semiconductor layer of LED B, to the second connecting layer 212'. Simply, the first current flow flows from the LEDs A, C, and E to the embedded resistor R'. Therefore, the second light-emitting group (LEDs A and E) and the bridge light-emitting diode (LED C) are forward biased to emit light. In the negative cycle of the AC power supply, the second current flow flows through the first light-emitting group (LEDs B and D) and the bridge light-emitting diode (LED C), such that the LEDs B, C, and D are forward biased to emit light.

Figure 3B:
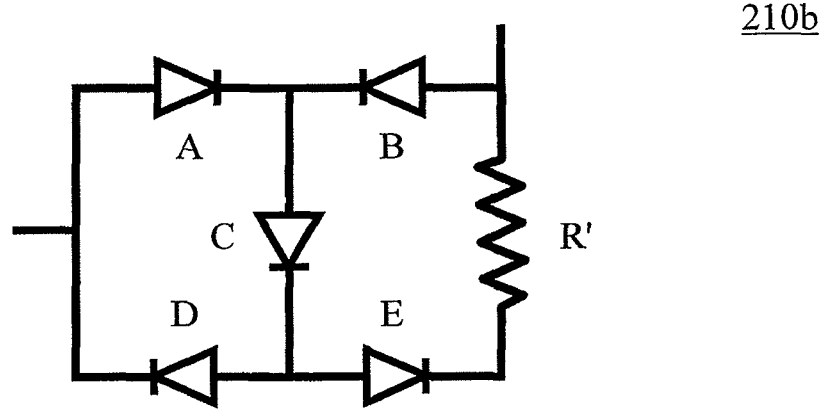
FIG. 3B shows a circuit diagram of the light-emitting unit of the light-emitting device in accordance with the second embodiment of the present disclosure.

FIG. 3B shows a circuit diagram of the light-emitting unit 210b. The embedded resistor R' is not limited to be embedded within any of the five LEDs A~E in accordance with the present disclosure. The resistance of the embedded resistor R' can be tuned by altering the doping concentration in the p-type semiconductor layer. Preferably, the p-type semiconductor layer comprises gallium nitride or gallium phosphide intentionally or unintentionally doped with Mg, thereby having a resistivity ranging from 0.01 to 0.7 Ω-cm.

Figure 4:
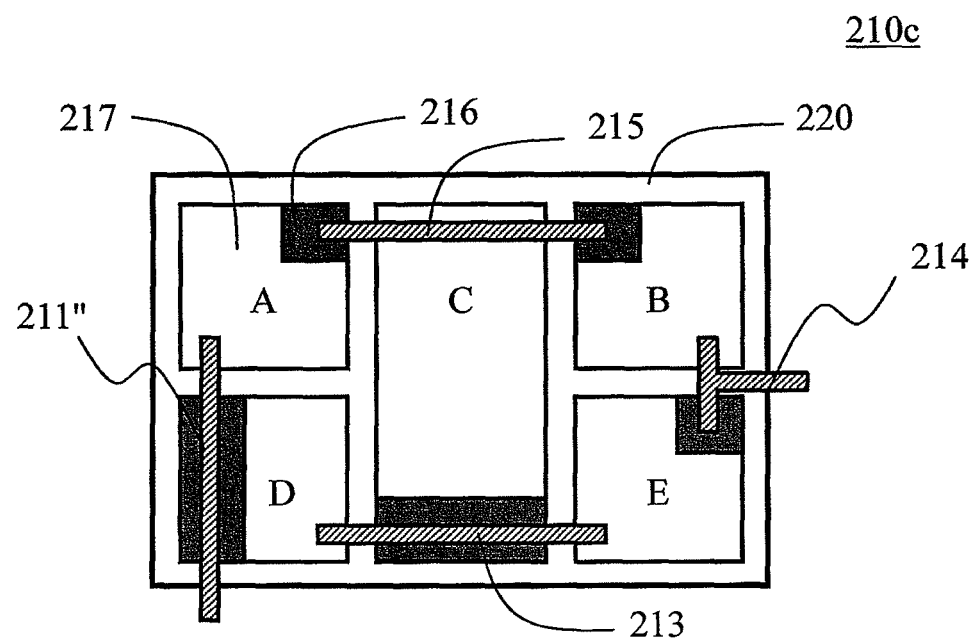
FIG. 4 shows a top view of a light-emitting unit of the light-emitting device in accordance with the third embodiment of the present disclosure.

FIG. 4 shows a top view of the light-emitting unit 210c in accordance with the third embodiment of the present disclosure. The difference between the light-emitting units 210 and 210c is that the first connecting layer 211" connects the LEDs A and D to an adjacent light-emitting unit.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A light-emitting device comprising:
a first light-emitting group comprising a first light-emitting diode comprising a first terminal, a second terminal, and a third terminal;
wherein the first light-emitting diode is configured not to be driven by a first current which flows through the first terminal and the second terminal;
wherein the first light-emitting diode is configured to be driven by a second current which flows through the third terminal and one of the first and second terminals.

2. The light-emitting device of claim 1, further comprising a second light-emitting group electrically connected to the first light-emitting group.

3. The light-emitting device of claim 2, wherein the second light-emitting group is configured to flow the first current.

4. The light-emitting device of claim 2, further comprising a bridge light-emitting diode; wherein the bridge light-emitting diode is electrically connected to the second light-emitting group in series under the first current, and the bridge light-emitting diode is electrically connected to the first light-emitting group in series under the second current.

5. The light-emitting device of claim 2, wherein the first and second light-emitting group forms a Wheatstone bridge for rectifying an alternating current signal of a power supply to a direct current signal.

6. The light-emitting device of claim 4, wherein the first and second light-emitting groups and the bridge light-emitting diode are formed on a common substrate.

7. The light-emitting device of claim 1, further comprising a second light-emitting diode, a third light-emitting diode, and an insulating layer formed between the first light-emitting diode and the second light-emitting diode, or between the first light-emitting diode and the third light-emitting diode.

8. The light-emitting device of claim 1, further comprising a substrate for supporting the first light-emitting group.

* * * * *